(12) United States Patent
Doczy et al.

(10) Patent No.: US 7,193,253 B2
(45) Date of Patent: Mar. 20, 2007

(54) TRANSITION METAL ALLOYS FOR USE AS A GATE ELECTRODE AND DEVICES INCORPORATING THESE ALLOYS

(75) Inventors: Mark Doczy, Beaverton, OR (US); Nathan Baxter, Portland, OR (US); Robert S. Chau, Beaverton, OR (US); Kari Harkonen, Kauniainen (FI); Teemu Lang, Helsinki (FI)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/202,541

(22) Filed: Aug. 11, 2005

(65) Prior Publication Data

US 2005/0280050 A1    Dec. 22, 2005

Related U.S. Application Data

(62) Division of application No. 10/641,848, filed on Aug. 15, 2003, now Pat. No. 7,030,430.

(51) Int. Cl.
*H01L 27/148* (2006.01)

(52) U.S. Cl. ........................ 257/249; 257/213
(58) Field of Classification Search ............... 257/213, 257/249
See application file for complete search history.

(56) References Cited

U.S. PATENT DOCUMENTS

| | | | |
|---|---|---|---|
| 4,673,968 A * | 6/1987 | Hieber et al. ............... | 257/388 |
| 5,189,504 A | 2/1993 | Nakayama et al. | |
| 5,654,242 A | 8/1997 | Komatsu | |
| 5,817,547 A | 10/1998 | Eom | |
| 5,913,111 A * | 6/1999 | Kataoka et al. ............. | 438/163 |
| 5,965,911 A | 10/1999 | Joo et al. | |
| 6,156,630 A | 12/2000 | Iyer | |
| 6,174,809 B1 | 1/2001 | Kang et al. | |
| 6,225,168 B1 | 5/2001 | Gardner et al. | |
| 6,255,698 B1 | 7/2001 | Gardner et al. | |
| 6,265,258 B1 | 7/2001 | Liang et al. | |
| 6,268,272 B1 | 7/2001 | Jang | |
| 6,291,282 B1 | 9/2001 | Wilk et al. | |
| 6,313,033 B1 | 11/2001 | Chiang et al. | |
| 6,365,450 B1 | 4/2002 | Kim | |
| 6,482,262 B1 | 11/2002 | Elers et al. | |

(Continued)

FOREIGN PATENT DOCUMENTS

EP          0 623 963           5/1994

(Continued)

OTHER PUBLICATIONS

Mackie et al: Transition metal carbide field emitters for field-emitter array devices and high current applications, Journal of Vacuum Science & tech., vol. 17, No. 2, Mar. 1999, pp. 613-619, XP012007426.

(Continued)

*Primary Examiner*—Doug Menz

(57)    ABSTRACT

Embodiments of a transition metal alloy having an n-type or p-type work function that does not significantly shift at elevated temperature. The disclosed transition metal alloys may be used as, or form a part of, the gate electrode in a transistor. Methods of forming a gate electrode using these transition metal alloys are also disclosed.

9 Claims, 8 Drawing Sheets

U.S. PATENT DOCUMENTS

| | | | |
|---|---|---|---|
| 6,495,438 | B1 | 12/2002 | Shinmura |
| 6,518,154 | B1 * | 2/2003 | Buynoski et al. ........... 438/585 |
| 6,544,876 | B1 | 4/2003 | Iyer |
| 2002/0058374 | A1 | 5/2002 | Kim et al. |
| 2002/0086504 | A1 | 7/2002 | Park et al. |
| 2003/0022457 | A1 | 1/2003 | Gutsche et al. |
| 2003/0031807 | A1 | 2/2003 | Elers et al. |
| 2003/0129793 | A1 | 7/2003 | Chau et al. |
| 2003/0129795 | A1 | 7/2003 | Chau et al. |
| 2004/0208994 | A1 | 10/2004 | Harkonen et al. |

FOREIGN PATENT DOCUMENTS

| | | |
|---|---|---|
| EP | 0 899 784 | 8/1998 |
| EP | 1 124 262 | 2/2001 |
| WO | WO 01/29280 A1 | 4/2001 |
| WO | WO 2004/061915 | 7/2004 |

OTHER PUBLICATIONS

Kobayashi: "First-principles study of the electronic properties of transition metal nitride surfaces", Database Compendex 'Online! Engineering Info., Inc., NY, NY, US XP002304085.

"First-principles study of the electronic properties of transition metal nitride surfaces", Surface Science Nov. 1, 2001, vol. 493, No. 1-3, pp. 665-670 XP002304077.

Park et al: "Robust ternary metal gate electrodes for dual gate CMOS devices", Database Compendex 'Online! Engineering Info., Inc., NY, NY<US XP 002304080.

"Robust ternary metal gate electrodes for dual gate CMOS devices" Technical Digest—International Electron Devices Meeting 2001, pp. 671-674, XP002310244.

Yoon Choi et al: "Effect of aluminium addition on the combustion reaction of titanium and carbon to form TiC", Database Inspec 'Online! The Institution of Electrical Engineers, Stevenage, GB, XP002304081.

Yoon Choi et al: "Effect of aluminum addition on the combustion reaction of titanium and carbon to form TiC", Journal of Materials Science, vol. 28, No. 24, 1993, pp. 6669-6675 XP00909256.

Pietzka et al: "Summary of constitutional data on the Al-C-Ti system" Journal of Phase Equilibria, vol. 15, No. 4 1994, pp. 392-400, XP009039302.

Samaveda, et al: "Evaluation of candidate metals for dual-metal gate CMOS with Hf02 gate dielectric" Database Inspec 'Online! The Institution of Electrical Engineers, Stavenage, GB; XP002304079.

Silicon Materials-Processing, Characterization and reliability. Symposium Apr. 1-5, 2002, San Francisco, CA, USA, pp. 85-90, XP009039269.

Tzenov et al: "Synthesis and characterization of Ti3A1C2" Database Inspec 'Online! The Institution of Electrical Engineers, Stevenage, GB; XP002304082.

Journal of the American Ceramic Society USA, vol. 83, No. 4, 2000. pp. 825-832, XP002310245.

Goryachev et al: "Effect of electrospark alloying of the surface of molybdenum and niobium on thermionic emission" Database Compendex 'Online! NY, NY, US; XP 002310246.

Goryachev et al: "Effect of electrospark alloying of the surface of molybdenum and niobium on thermionic emission", Sov Surf Eng Appl electrochem 1987, No. 4, pp. 11-16. XP009039191.

International Preliminary Report on Patentability, PCT Application No. PCT/US2004/025977, filed Aug. 11, 2004, 9 pages.

* cited by examiner

TRANSITION METAL ALLOYS FOR USE AS A GATE ELECTRODE AND DEVICES INCORPORATING THESE ALLOYS

CLAIM OF PRIORITY

This application is a divisional of U.S. patent application Ser. No. 10/641,848, filed Aug. 15, 2003, now U.S. Pat. No. 7,030,430.

FIELD OF THE INVENTION

The invention relates generally to integrated circuit devices and, more particularly, to metal alloys that can be used as a gate electrode in a transistor.

BACKGROUND OF THE INVENTION

Illustrated in FIG. 1 is a conventional MOSFET (Metal Oxide Semiconductor Field Effect Transistor) 100. For an n-type MOSFET, the transistor 100 includes n-type source and drain regions 120a, 120b, respectively, formed in a p-doped substrate 110. A gate electrode 130 is disposed between the source and drain regions 120a, 120b, this gate electrode being separated from the substrate 110 and the source and drain regions 120a–b by a gate insulating layer 140. Insulating layers 150a, 150b further isolate the gate electrode 130 from the surrounding structures. Conductors 160a, 160b (e.g., conductive traces) may be electrically coupled with the source and drain regions 120a, 120b, respectively. If a sufficient voltage is applied to the gate electrode—i.e., the "threshold voltage"—electrons will flow from the source to the drain, these mobile electrons concentrated in a thin "inversion layer" 170 extending between the source and drain regions 120a, 120b. Of course, those of ordinary skill in the art will recognize that the complementary MOSFET—i.e., the p-type MOSFET—will have a similar structure (p-type source and drain regions on an n-type substrate), and that a CMOS (Complementary Metal Oxide Semiconductor) integrated circuit will utilize both n-type and p-type MOSFETs (or, more generally, both NMOS and PMOS devices).

In conventional MOSFET devices, the gate electrode 130 typically comprises a poly-silicon material, whereas the gate insulating layer comprises Silicon Dioxide ($SiO_2$). To increase circuit density and improve device performance, it may be desirable to scale down the thickness of the gate insulating layer 140 (often referred to as the "gate oxide"). As the thickness of the gate oxide is scaled down, it may be necessary to use a material having a higher dielectric constant—i.e., a "high-k dielectric"—as the gate oxide in order to maintain sufficient capacitance while also preventing failure by electron tunneling. Integration of a poly-silicon gate electrode onto a high-k gate oxide has, however, proven difficult due to interactions between the poly-silicon gate material and the high-k insulating material. Furthermore, as the thickness of the gate insulating layer 140 is further scaled down (e.g., below about 20 Angstroms), it may be desirable to use an alternative material to poly-silicon as the gate electrode, in order to eliminate the thickness contribution of poly depletion to the gate oxide (i.e., to eliminate that portion of a poly-silicon gate electrode that becomes depleted of free charges and, hence, adds to the effective thickness of the gate insulating layer).

Use of a metal gate electrode can eliminate the above-described effects of depleted poly-silicon in the gate electrode, and a metal gate electrode may also enable further scaling down of the gate oxide thickness. However, use of metal materials as the gate electrode in NMOS and PMOS devices has also proven difficult. To optimize the performance of a transistor, the metal used at the gate electrode should be selected to provide a work function that will achieve a sufficiently low (but non-zero) threshold voltage for the transistor (e.g., 0.2 V to 0.3 V). Many metals have a suitable work function (a value representing an energy level of the most energetic electrons within the metal), but are thermally unstable at high temperature. Process flows for transistors can often reach temperatures of 900° C. and, therefore, during subsequent processes, the work function of these metals may shift to unsuitable values. Furthermore, at elevated temperatures, these metal gate materials may react with the gate insulating layer, thereby degrading its insulating properties. Other metals are thermally stable at the temperatures present in transistor process flows; however, these metals have work functions that are inadequate for high performance transistors.

DETAILED DESCRIPTION OF THE INVENTION

Figure 1:
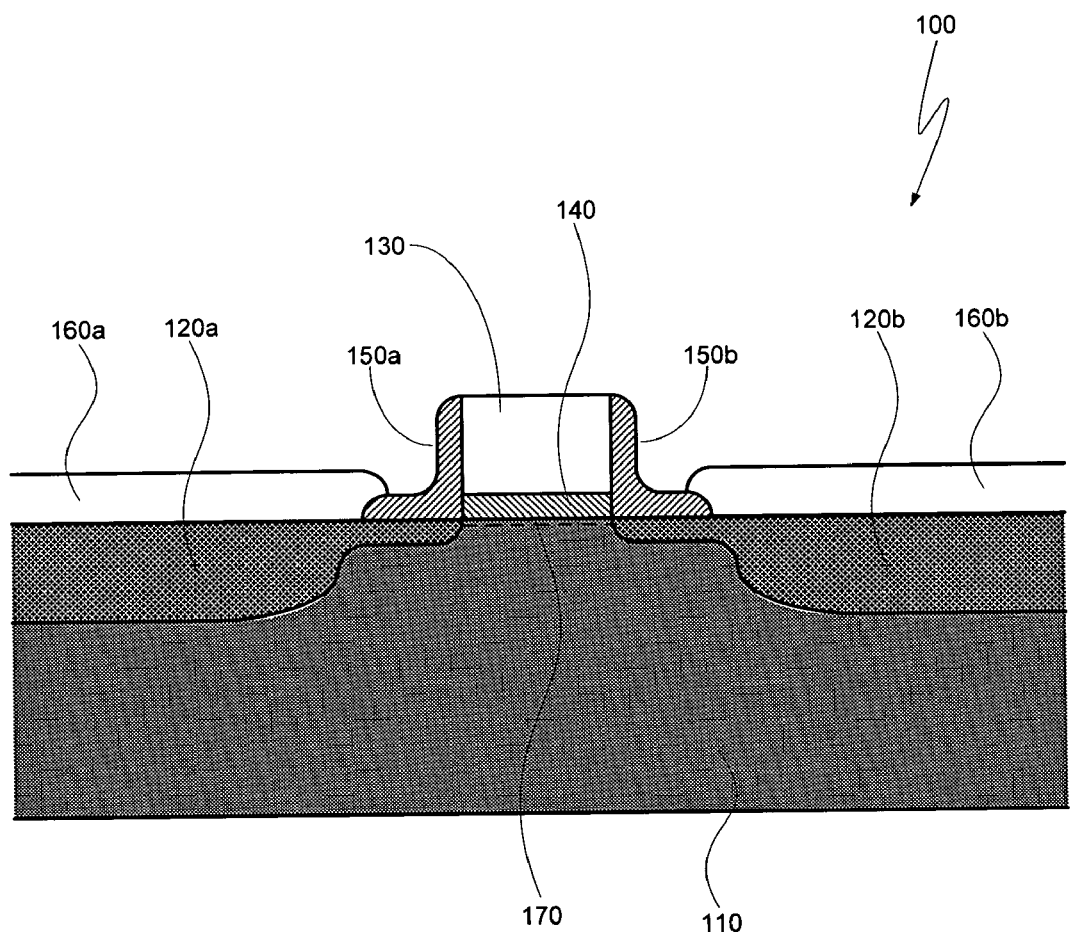
FIG. 1 is a schematic diagram illustrating an embodiment of a conventional MOSFET transistor.

For high performance transistors, it is desirable to have a low, but non-zero, threshold voltage—i.e., the gate voltage at which electrons (or, in the case of p-type devices, holes) begin to flow between the source and drain regions. Many factors can effect the threshold voltage of a transistor, and one of these factors is the work function of the gate electrode material. However, for many transistor designs, most of the other factors that can effect the threshold voltage are "locked in" by design constraints, such that the primary factor determining the transistor's threshold voltage is the work function of the gate electrode. Thus, selection of the gate electrode work function plays a significant role in setting the threshold voltage of an optimized, high performance (e.g., high switching speed, high drive current, etc.) MOSFET device. As noted above, the "work function" of a material, such as a metal, describes the energy level of the most energetic electrons within the material.

The performance of a transistor is governed not so much by the absolute value of the gate electrode material's work function, but rather by the relationship between the gate electrode's work function and the work function of the underlying substrate material (e.g., Silicon, Gallium Arsenide, Silicon on insulator, etc.). Negative channel semiconductor devices—i.e., those that rely on the movement of electrons during activation—require an "n-type work function", whereas positive channel semiconductor devices—i.e. those that rely on the movement of electron vacancies, or holes, during activation—require a "p-type work function." A gate electrode has an n-type work function if the electrode material's work function is near (e.g., within +/−0.3 eV) of the energy level of the underlying substrate material's conduction band. Conversely, a gate electrode has a p-type work function if the electrode material's work function is near the energy level of the substrate material's valence band. Generally, for semiconductor materials, the valence band is the highest range of electron energies where electrons are normally present, whereas the conduction band is a range of electron energies above the valence band where electrons are free to accelerate under application of an electric field (and, thus, create an electric current).

By way of example, Silicon has a conduction band energy level of approximately 4.1 eV and a valence band energy level of approximately 5.2 eV. Thus, for a Silicon substrate, the gate electrode of a negative channel MOSFET (or NMOS) device would have an n-type work function of approximately 4.1 eV (+/−0.3 eV), and the gate electrode of a positive channel MOSFET (or PMOS) device would have a p-type work function of approximately 5.2 eV (+/−0.3 eV). Note that energy levels falling between the valence band and conduction band energy levels are often referred to as "midgap" energies (e.g., returning to the above example using Silicon, the midgap energies are those falling between approximately 4.4 and 4.9 eV). Also, the difference between the work function of the gate electrode material and the work function of the substrate material is often referred to as the "flatband" energy. However, because the work function of the substrate is often fixed—i.e., it is one of the "locked in" features of a transistor design—the term "flatband" is sometimes used in a manner that is synonymous with the term "work function."

Disclosed herein are embodiments of a transition metal alloy having either an n-type work function or a p-type work function. The disclosed transition metal alloys may be used as the gate electrode in CMOS integrated circuits, and embodiments of methods of forming a gate electrode using such a transition metal alloy are also disclosed below. In one embodiment, the transition metal alloys are thermally stable at elevated temperatures (e.g., greater than 900° C.)—i.e., their work function does not shift or, in other words, there is no appreciable flat band shift. In another embodiment, the transition metal alloys, when used as a gate electrode, do not react with the underlying gate insulating layer at elevated temperature. In a further embodiment, a transition metal alloy comprises a transition metal carbide.

Figure 2:
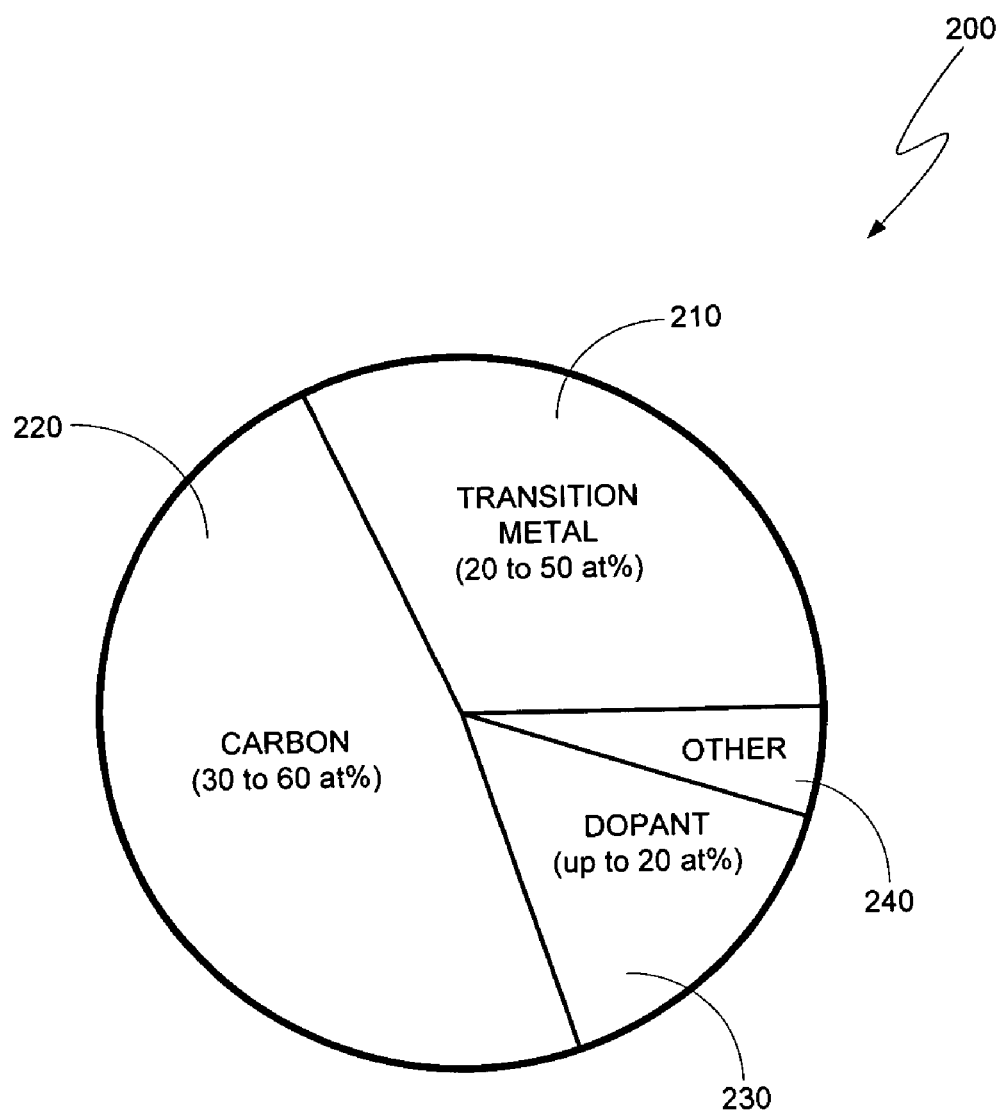
FIG. 2 is a schematic diagram illustrating the composition of one embodiment of a transition metal alloy that can be used as a gate electrode.

Turning now to FIG. 2, illustrated is one embodiment of a transition metal alloy 200 that may have an n-type work function—or, alternatively, a p-type work function—that is suitable for use as a gate electrode in MOSFET devices (e.g., either n-type or p-type). The transition metal alloy 200 includes a transition metal 210, Carbon (C) 220 (or other suitable element, as described below), and a dopant 230.

Generally, the transition metal 210 is selected to provide either an n-type work function or a p-type work function. In one embodiment, the transition metal comprises one of Titanium (Ti), Tantalum (Ta), Zirconium (Zr), and Hafnium (Hf). In another embodiment, the transition metal may comprise any one of the aforementioned elements or one of Chromium (Cr), Molybdenum (Mo), Tungsten (W), Vanadium (V), and Niobium (Nb). In one embodiment, the transition metal 210 comprises between 20 and 50 atomic percent ("at %") of the alloy 200. In yet another embodiment, the alloy 200 includes two or more of the above-listed transition metals.

Carbon 220 may be another component of the transition metal alloy 200. In one embodiment, carbon comprises between 30 and 60 at % of the alloy 200. Some transition metals, when alloyed with Carbon to form a transition metal carbide (or other alloy including Carbon with no or minimal amounts of carbide), will be characterized by good thermal stability—i.e., at least some material properties of these transition metal carbides, such as the work function, do not degrade at elevated temperature. It should be understood, however, that Carbon is but one example of an element that can be alloyed with a transition metal to improve thermal characteristics. In addition to Carbon, other elements that may be alloyed with a transition metal to achieve enhanced thermal properties include, for example, Nitrogen (N), Silicon (Si), Germanium (Ge), and Boron (B), or various combinations of these elements.

The transition metal alloy 200 also includes a dopant 230, as noted above. The dopant is introduced into the transition metal alloy to adjust or alter certain characteristics of the alloy. In one embodiment, the dopant is added to effect the work function of the alloy (e.g., to enhance either the n-type or p-type work function characteristics). In another embodiment, the dopant is added to alter another property of the transition metal alloy, such as conductivity. The dopant may, in one embodiment, comprise up to 20 at % of the transition metal alloy. In one embodiment, the dopant comprises Aluminum (Al)—e.g., for an n-type work function—and in another embodiment, the dopant comprises Platinum (Pt)—e.g., for a p-type work function. Other possible dopants include Silicon, Gallium (Ga), and Germanium (Ge), as well as many of the transition metals.

As shown in FIG. 2, the transition metal alloy 200 may further include other, residual substances 240. The residual elements are typically present in the transition metal alloy in relatively small amounts as a result of the deposition process or other fabrication steps. In one embodiment, the residual substances comprise approximately 5 at % or less of the alloy's composition. Common residual substances include Nitrogen and Oxygen, as well as halide impurities such as chloride. It should, however, be understood, as suggested above, that elements such as Nitrogen may be a desired component of the alloy 200 in other embodiments.

In one embodiment, the transition metal alloy 200 is a transition metal carbide comprising between 20 and 50 at % Titanium, between 30 and 60 at % Carbon, and up to 20 at % Aluminum. Such a transition metal carbide may provide an n-type work function. In a further embodiment, the transition metal carbide comprises approximately 37 at % Titanium, approximately 55 at % Carbon, and approximately 4 at % Aluminum, as well as approximately 4 at % Oxygen and 1 at % or less Nitrogen. Of course, those of ordinary skill in the art will appreciate that these are but a few examples of transition metal alloys that may be useful as a gate electrode material.

In one embodiment, the transition metal alloy 200 is thermally stable at elevated temperature, and in a further embodiment, the transition metal alloy 200 has a thermally stable work function at elevated temperature, as measured on a high-k dielectric gate material, such as $ZrO_2$, $HfO_2$, or $Al_2O_3$. In one embodiment, the transition metal alloy 200 exhibits thermal stability—e.g., the alloy's work function does not shift to a midgap energy level—at a temperature up to approximately 900° C. When the transition metal alloy 200 is used as a gate electrode in a MOSFET device, this enhanced thermal stability enables the gate electrode structure to withstand the high post-deposition processing temperatures that such device are routinely subjected to in the manufacturing process. Thus, the work function—and ultimately the performance—of the transistor will not degrade during later stages of a CMOS process flow.

Figure 3:
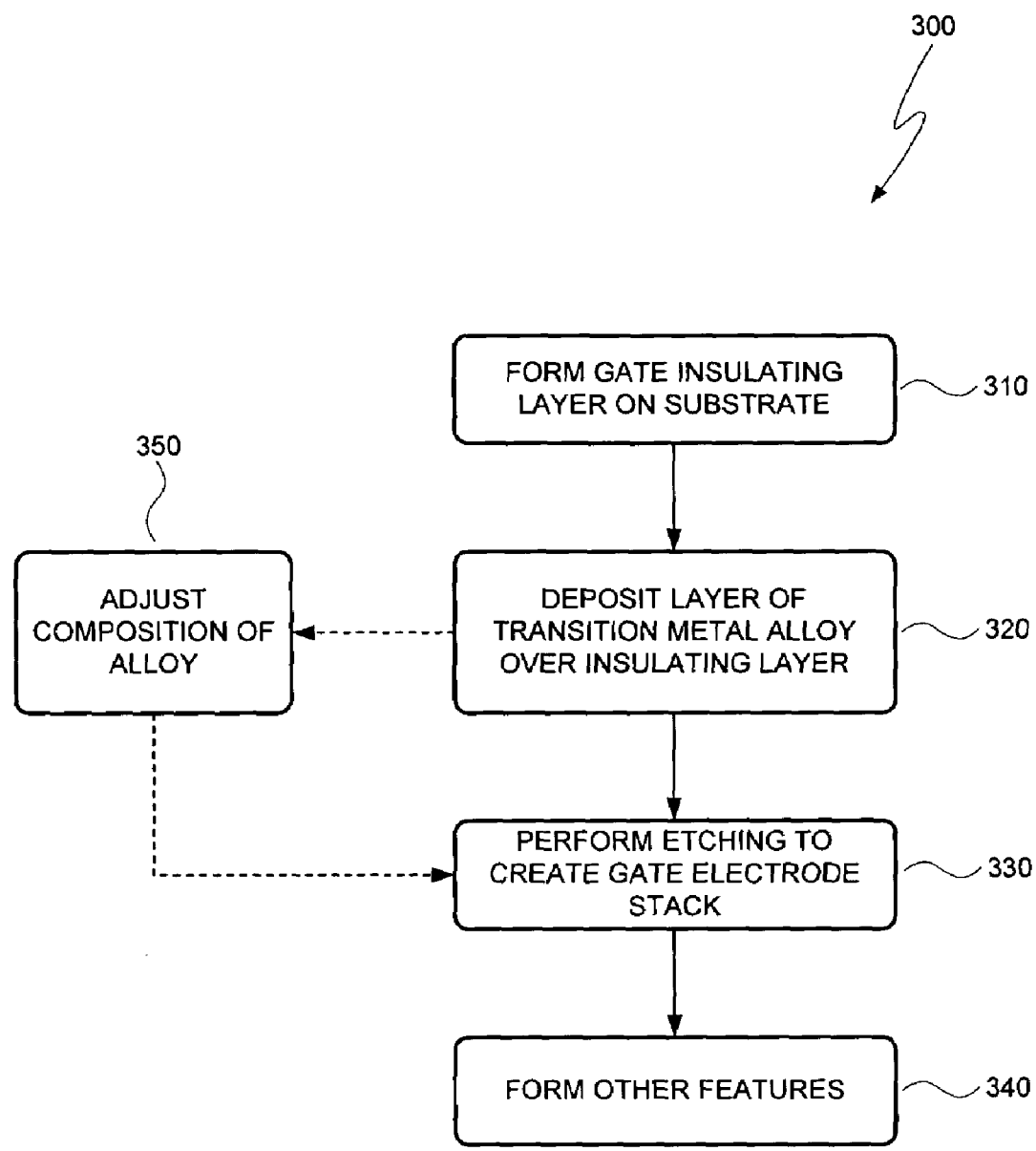
FIG. 3 is a block diagram illustrating one embodiment of a method of forming a gate electrode including a transition metal alloy.

Illustrated in FIG. 3 is an embodiment of a method 300 of forming a gate electrode using a transition metal alloy. Also, the method 300 of FIG. 3 is further illustrated by the schematic diagrams of FIGS. 4A through 4E, and reference should be made to these figures, as called out in the text.

Figure 4A:
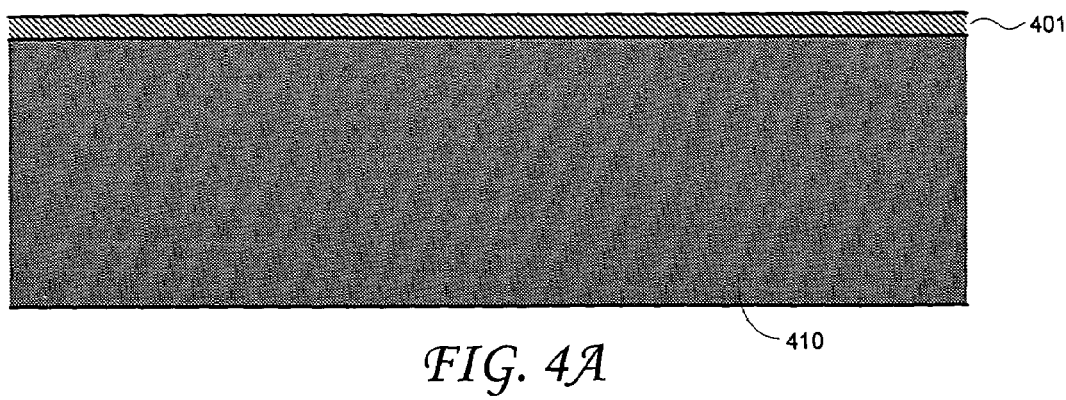
FIGS. 4A–4E are schematic diagrams illustrating further embodiments of the method of forming a gate electrode, as shown in FIG. 3.

Referring to block 310 in FIG. 3, a gate insulating layer is deposited on a substrate. This is illustrated in FIG. 4A, which shows a layer of gate insulating material 401 that has been deposited on a surface of a substrate 410. In one embodiment, the gate insulating material 401 comprises a high-k dielectric material, such as $ZrO_2$, $HfO_2$, or $Al_2O_3$. The layer of gate insulating material 401 may be deposited using any suitable technique. In one embodiment, the gate insulating material layer 401 is formed by a blanket layer deposition process, such as chemical vapor deposition (CVD) or physical vapor deposition (PVD).

In one embodiment, where an NMOS device is to be formed, the substrate 410 comprises a p-doped substrate (and the source and drain regions that are formed will comprise n-doped regions). In another embodiment, where a PMOS device is to be formed, the substrate 410 comprises an n-doped substrate (and the source and drain regions that are formed will comprise p-doped regions). In one embodiment, the substrate 410 comprises Silicon (e.g., single crystal Silicon); however, it should be understood that, in other embodiments, the substrate 410 may comprise another material (e.g., GaAs, Silicon-on-insulator, etc.).

Figure 4B:
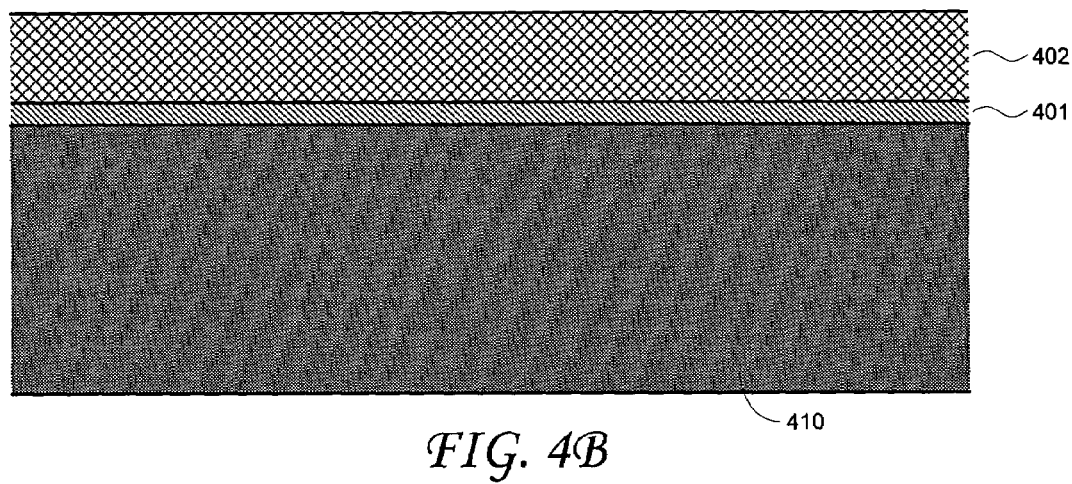

A layer of a transition metal alloy is then deposited over the gate insulating material layer, as set forth in block 320. This is illustrated in FIG. 4B, where a layer of a transition metal alloy 402 has been formed over the layer of gate insulating material 401. In one embodiment, the layer of transition metal alloy 402 comprises the transition metal alloy 200 shown and described above with respect to FIG. 2. In a further embodiment, the layer of transition metal alloy 402 comprises a transition metal carbide and, in yet another embodiment, the transition metal alloy layer 402 comprises a transition metal carbide including Titanium, Carbon, and Aluminum. In yet a further embodiment, the transition metal alloy layer 402 comprises approximately 37 at % Titanium, 55 at % Carbon, and 3 at % Aluminum, as well as approximately 4 at % Oxygen and 1 at % or less Nitrogen.

The transition metal alloy layer may be deposited using any suitable technique. In one embodiment, the transition metal alloy layer 402 is deposited to a thickness of between approximately 500 and 2,000 Angstroms. The transition metal alloy layer 402 is, in one embodiment, deposited by a PVD process using a TiC(Al) target in a single chamber having an Argon gas environment (introduced at a flow rate of 10–200 sccm) at a pressure of between 1 and 100 mTorr with the substrate maintained at a temperature between 0° and 450° C. Deposition may take place using a DC power source in the 1 kW to 40 kW range and, in another embodiment, pulsed DC power at a frequency of between 1 and 100 kHz is utilized. In a further embodiment, the gate electrode material is deposited by a PVD process using a Ti(Al) target in a first chamber and a Carbon target in a second chamber, wherein the gate electrode is formed by alternating thin (e.g., 5–10 Angstroms) layers of Ti(Al) and Carbon (e.g., 5–10 Angstrom layers to a final thickness of between 500 and 2,000 Angstroms).

In another embodiment, the transition metal alloy layer 402 is deposited by a CVD process. Deposition is performed in a CVD chamber at a pressure of 0.25 to 10.0 Torr and at a temperature of between 150° C. and 600° C. Precursors introduced into the deposition chamber include $TiCl_4$ vapor at a flow rate of 10 to 1000 sccm, TMA (trimethylaluminum, or $Al(CH_3)_3$) vapor at a flow rate of 10 to 1000 sccm, as well as ammonia ($NH_3$) at a flow rate up to 10 sccm. Also, an inert gas, such as $N_2$, Argon (Ar), or Helium (He), may be introduced into the deposition chamber (e.g., as either a transport agent or as a purging agent) at a flow rate up to 4,000 sccm.

In yet a further embodiment, the transition metal alloy layer 402 is deposited using an atomic layer deposition (ALD) process.

Figure 4C:
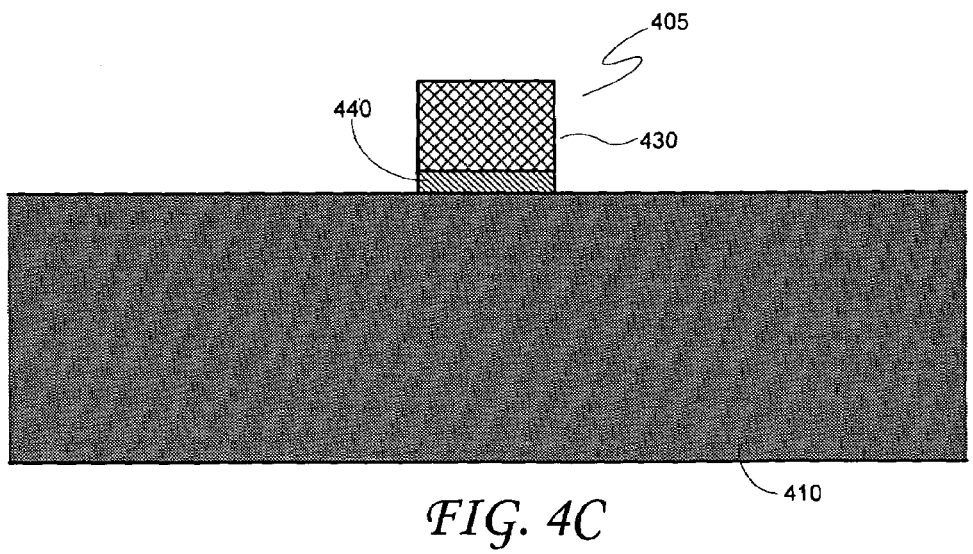

Returning to FIG. 3, etching is then performed to create the gate electrode stack, as set forth at block 330. This is illustrated in FIG. 4C, where both the transition metal alloy layer 402 and gate insulating material layer 401 have been etched to create a gate electrode stack 405. The gate electrode stack includes a gate electrode 430 overlying a gate insulating layer 440. Any suitable etching processes may be employed to etch the transition metal alloy layer 402 and gate insulating material layer 401 in order to form the gate electrode 430 and gate insulating layer 440. Although not shown in the figures, it will be appreciated by those of ordinary skill in the art that a patterned mask layer may be formed prior to etching.

Figure 4D:
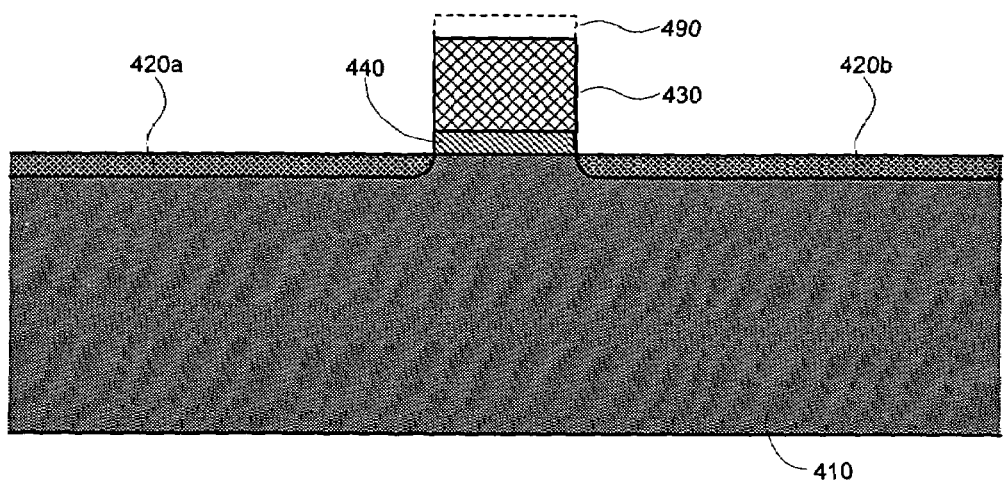
Figure 4E:
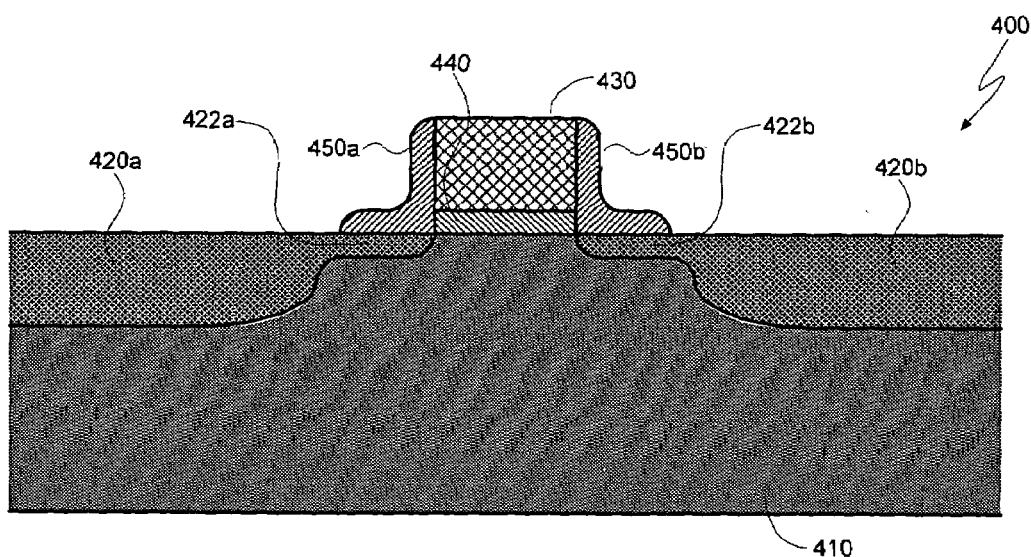

Referring to block 340, additional features may then be formed on the substrate to create an NMOS or PMOS device. This is illustrated in FIGS. 4D and 4E, where additional features have been created to form a device 400. Referring first to FIG. 4D, source and drain regions 420a, 420b are created. For an NMOS transistor, the source and drain regions 420a, 420b will comprise n-type regions, whereas for a PMOS transistor, the source and drain regions will comprise p-type regions. An ion implantation process may be employed to create the source and drain regions 420a, 420b. Depending upon the composition of the gate electrode 430, it may be desirable to deposit a hard mask layer 490 (shown in dashed line) over the gate electrode 430 during ion implantation in order to inhibit the implantation of ions at the gate electrode.

Turning to FIG. 4E, insulating layers 450a, 450b have been formed, and further ion implantation has been performed to create deeper source and drain regions 420a, 420b. The insulating layers 450a, 450b also function as masks to inhibit the implantation of ions in the underlying substrate 410, thereby forming source and drain extensions 422a, 422b, respectively. Ion implantation on the gate electrode material may be inhibited using a hard mask, as noted above. Other features that may be formed include conductive interconnects (e.g., see FIG. 1, items 160a–b), as well as a passivation layer.

In an alternative embodiment, which is set forth in block 350 in FIG. 3, the composition of the transition metal alloy layer 402 is adjusted during the deposition process. As noted above, in one embodiment, the gate electrode may comprise alternating thin layers of different substances (e.g., Ti(Al) and C). Other variations in the deposition process (e.g., pressure, temperature, pulse rate, process sequences, precursors, etc.) may effect the final composition of the transition metal alloy. In one embodiment (see block 350), variations in the deposition process are introduced to alter the composition of the transition metal alloy. For example, this additional alloying of the gate electrode material during deposition can be used to convert the work function—e.g., from an n-type to a p-type—which can provide for a simplified process flow (i.e., by avoiding deposition of two separate gate electrode materials for n-channel and p-channel devices). As will be appreciated by those of ordinary skill in the art, conversion of the work function is but one example of the gate electrode's characteristics that can be altered through this additional alloying and, further, that such variations in the deposition process can be used to adjust other chemical and electrical properties of the gate electrode material.

In the embodiments illustrated with respect to FIGS. 3 and 4A–4E, the transition metal alloy functions as a gate electrode. However, the disclosed transition metal alloys are not so limited in function and application. In addition to use as a conductor and gate electrode, the disclosed transition metal alloys may, in other embodiments, function as a barrier layer and/or an etch stop. Embodiments of the use of the disclosed transition metal alloys as a diffusion barrier and/or etch stop (as well as part of a gate electrode) are shown and described below with respect to FIGS. 5 and 6A through 6E.

Figure 5:
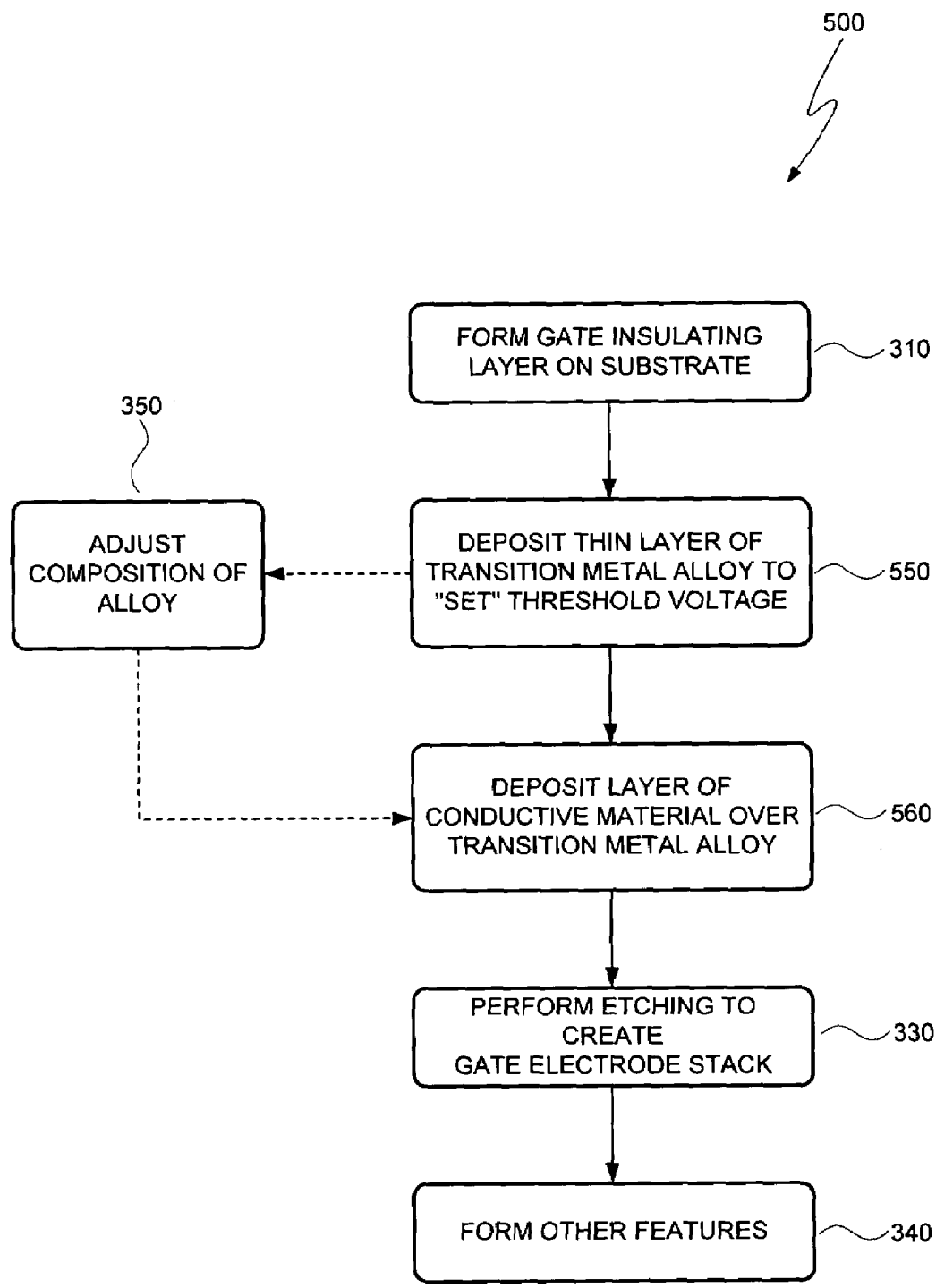
FIG. 5 is a block diagram illustrating another embodiment of a method of forming a gate electrode including a transition metal alloy.

Thus, turning now to FIG. 5, illustrated is another embodiment of a method 500 of forming a gate electrode using a transition metal alloy. The method 500 of FIG. 5 is further illustrated by the schematic diagrams of FIGS. 6A through 6E, and reference should be made to these figures, as called out in the text. Also, many of the drawing elements shown in FIGS. 5 and 6A–6E are the same or similar to those shown in FIGS. 3 and 4A–4E, respectively, and like reference numerals are used to refer to the same items in FIGS. 5 and 6A–6E.

Figure 6A:
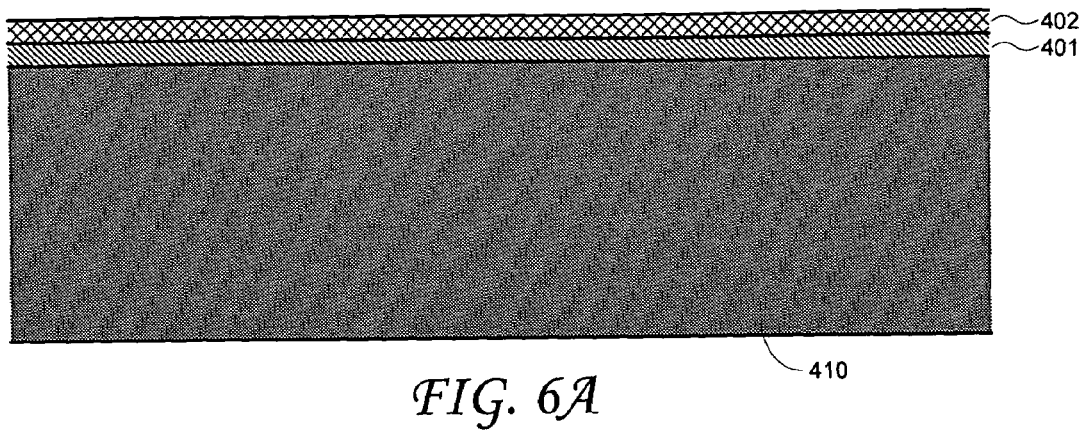
FIGS. 6A–6E are schematic diagrams illustrating further embodiments of the method of forming a gate electrode, as shown in FIG. 5.

Referring to block 310, a layer of gate insulating material is formed on a substrate. This is illustrated in FIG. 6A, which shows a gate insulating material layer 401 that has been deposited on a substrate 410, as described above. Again, the gate insulating material layer 401 may, in one embodiment, comprise a high-k dielectric material (e.g., $ZrO_2$, $HfO_2$, $Al_2O_3$, etc.

As set forth at block 550, a relatively thin layer of a transition metal alloy is deposited over the gate insulating material layer to "set" the threshold voltage of the transistor. This is also illustrated in FIG. 6A, where a thin layer of a transition metal alloy 602 has been deposited over the gate insulating material layer 401. In one embodiment, the thickness of the transition metal alloy layer 602 is between 25 and 100 Angstroms.

In one embodiment, the layer of transition metal alloy 602 comprises the transition metal alloy 200 shown and described above with respect to FIG. 2. In a further embodiment, the layer of transition metal alloy 602 comprises a transition metal carbide and, in yet another embodiment, the transition metal alloy layer 602 comprises a transition metal carbide including Titanium, Carbon, and Aluminum. In yet a further embodiment, the transition metal alloy layer 602 comprises approximately 37 at % Titanium, 55 at % Carbon, and 3 at % Aluminum, as well as approximately 4 at % Oxygen and 1 at % or less Nitrogen. The layer of transition metal alloy 602 may be deposited using any suitable blanket deposition technique, such as PVD, CVD, or ALD, as described above.

Figure 6B:
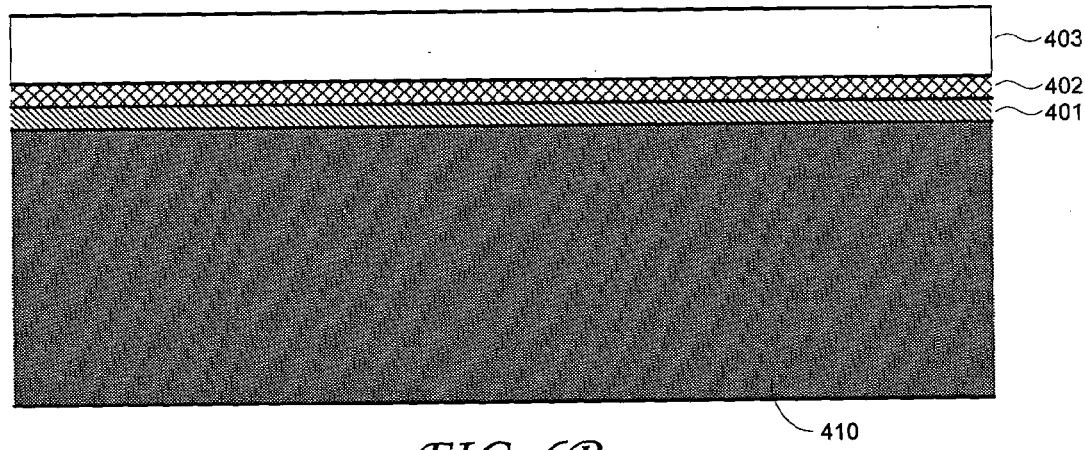

A layer of a conductive material is then deposited over the layer of transition metal alloy, as set forth in block 560. This is illustrated in FIG. 6B, where a layer of conductive material 603 has been deposited over the transition metal alloy layer 602 to form a gate electrode. The conductive material layer 603 may comprise any suitable conductive material, such as poly-silicon or Aluminum. In one embodiment, the thickness of the conductive material layer 603 is between 500 and 2,000 Angstroms.

The conductive material layer 603 may be deposited using any suitable deposition technique. In one embodiment, the conductive material layer 603 is deposited using a blanket deposition process, such as CVD or PVD. In another embodiment, the conductive material layer 603 is deposited using a selective deposition technique. In this embodiment, the transition metal gate electrode and gate insulating layer are first patterned by etching, and the conductive material is selectively deposited on the transition metal gate electrode using a selective deposition technique, such as electroplating or electroless plating.

Figure 6C:
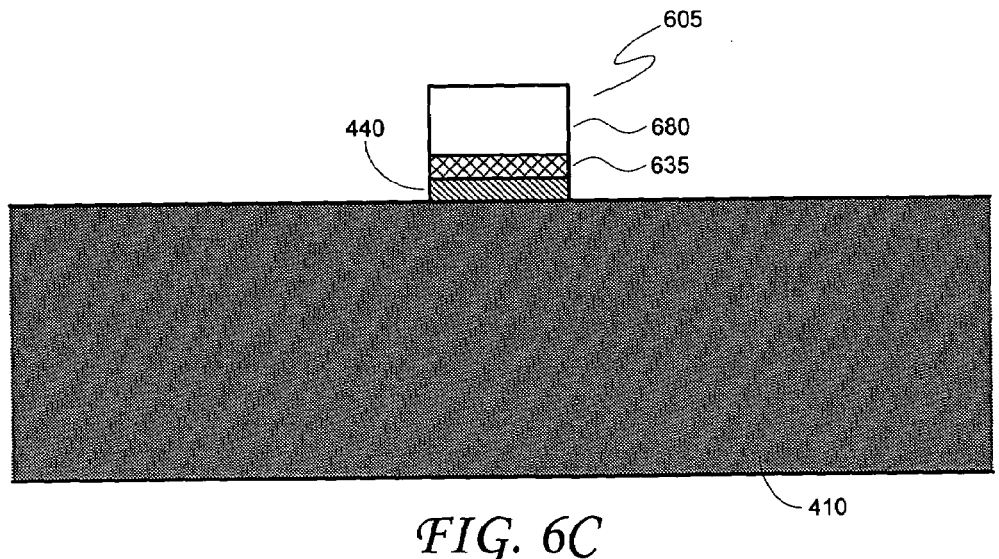

Etching is then performed to create the gate electrode stack, as set forth at block 330 in FIG. 5. This is illustrated in FIG. 6C, where both the conductive material layer 603, transition metal alloy layer 602, and gate insulating material layer 401 have each been etched to create a gate electrode stack 605. The gate electrode stack 605 includes a conductive layer 680 overlying a transition metal alloy layer 635 which, in turn, overlies a gate insulating layer 440. Any suitable etching processes may be employed to etch the conductive material, transition metal alloy, and gate insulating material layers 603, 602, 401, respectively. Although not shown in the figures, it will be appreciated by those of ordinary skill in the art that a patterned mask layer may be formed prior to etching.

Figure 6D:
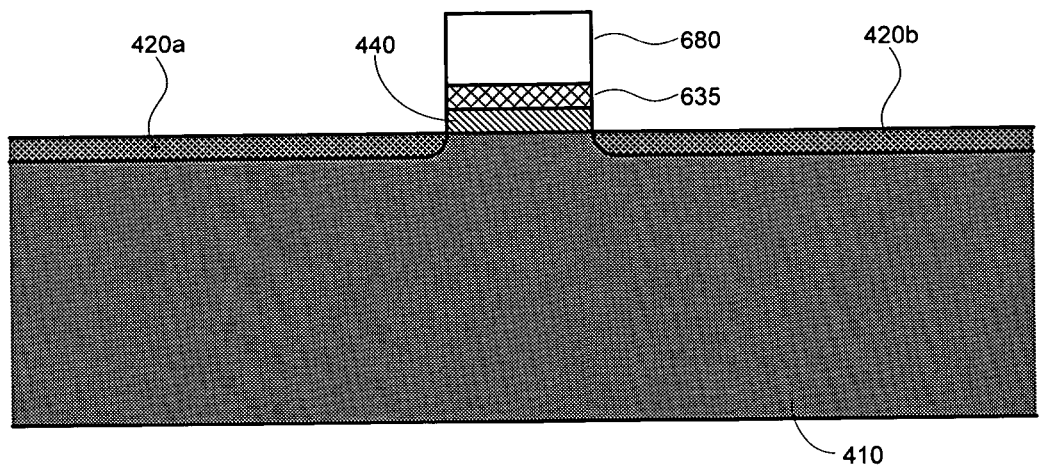
Figure 6E:
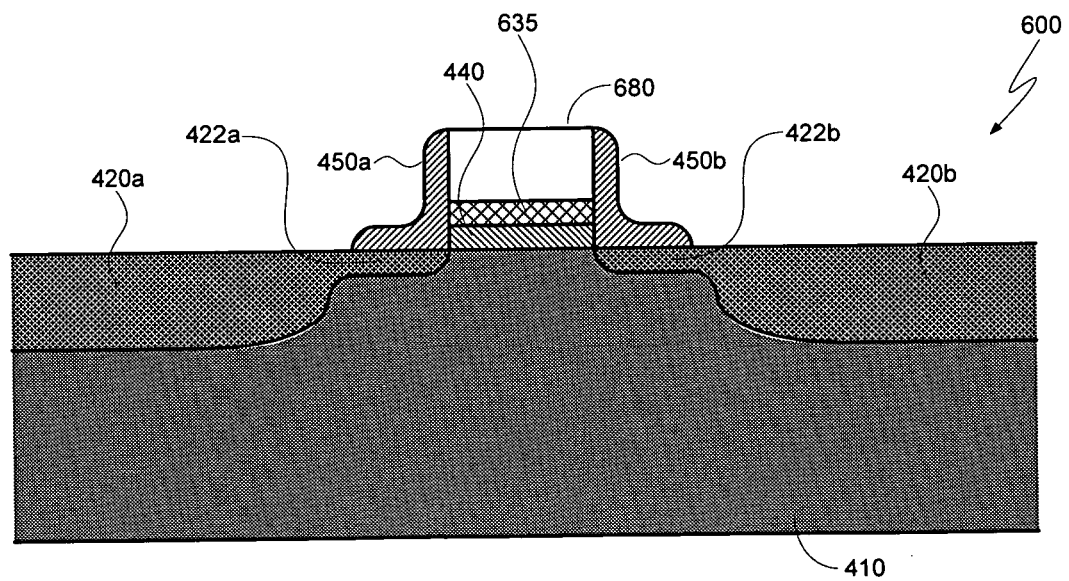

Additional features may then be formed on the substrate to create an NMOS or PMOS device, as set forth at block 340. This is illustrated in FIGS. 6D and 6E, where additional features have been created to form a device 600. With reference to FIG. 6D, source and drain regions 420a, 420b are created by ion implantation. As previously noted, a hard mask may not be needed in this embodiment, where the conductive material layer 680 (e.g., poly-silicon) may itself function as a hard mask during ion implantation. Referring now to FIG. 6E, insulating layers 450a, 450b have been formed. Further ion implantation results in the formation of deeper source and drain regions 420a, 420b, and the insulating layers 450a, 450b inhibit the implantation of ions in the underlying substrate 410, such that source and drain extensions 422a, 422b are created, all as described above. Other features that may be formed include conductive interconnects (e.g., see FIG. 1, items 160a–b), as well as a passivation layer.

As suggested above, the disclosed transition metal alloys are not limited in function to their role as a conductor and gate electrode. In one embodiment, the disclosed transition metal alloys may further function as a barrier layer material and, in another embodiment, these transition metal alloys may function as an etch stop, as will now be described in more detail.

For some embodiments, the transition metal alloy 200 may not be a "good" conductor. In this case, it may be desirable to using a relatively thin layer of the transition metal alloy—as shown in FIG. 6C—to achieve a desired threshold voltage with the optimal work function characteristics of the transition metal alloy, and then form another layer on top of the transition metal alloy of a relatively good conductor, such as Aluminum. However, many metals such as Aluminum that are good conductors will react with (e.g., lose electrons to) the underlying gate insulator material. Thus, in this instance, the thin layer of transition metal alloy functions as a barrier layer.

In another embodiment, as noted above, a relatively thin layer of a transition metal alloy can function as an etch stop. As an etch stop, a thin transition metal alloy layer is again applied to "set" the threshold voltage of the transistor. A conductive material that more readily etches—e.g., poly-silicon—is then deposited over the thin transition metal alloy layer (see FIGS. 6B and 6C). Etching of the conductive layer (e.g., poly-silicon) stops at the thin transition metal alloy layer, and another etch process is performed to remove any remaining transition metal alloy. Materials such as poly-silicon are very amenable to anisotropic etching processes and, further, because the transition metal alloy layer is relatively thin as compared to the overall thickness of the gate electrode (i.e., the electrode stack including the transition metal alloy layer and the conductive material layer), this layer is easily to removed. Note also that poly-silicon can function as a hard mask material during ion implantation and, therefore, where the conductive material layer 680 comprises poly-silicon (or other similar material), a hard mask (see FIG. 4D, item 490) may not be necessary during formation of the source and drain regions by ion implantation.

Embodiments of a transition metal alloy that may be used in the gate electrode of a transistor—as well as methods of forming a gate electrode for a transistor—having been herein described, those of ordinary skill in the art will appreciate the advantages of the disclosed embodiments. The disclosed transition metal alloys can function as a gate electrode in NMOS or PMOS devices, and these transition metal alloys are thermally stable—e.g., the alloy's work function does not significantly shift nor does the alloy react with the underlying insulating material—at temperatures up to 900° C. Thus, the disclosed transition metal alloys can be integrated into existing CMOS process flows, where processing temperatures can approach 900° C. Also, using one of the disclosed transition metal alloys as the gate electrode in a transistor allows for further scaling down of the thickness of the gate oxide. Further, in addition to functioning as a conductor and gate electrode, the disclosed transition metal alloys can also serve as a barrier layer and/or etch stop.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A device comprising:
   a substrate having a source region and a drain region formed therein;
   an insulating layer disposed on the substrate and extending between the source and drain regions; and
   a gate electrode overlying the insulating layer, the gate electrode formed of an alloy including
      approximately 20 to 50 atomic percent of a transition metal,
      approximately 30 to 60 atomic percent of a combination of one or more elements, the combination of elements including at least one element selected from a group consisting of carbon, nitrogen, silicon, germanium, and boron, and
      up to approximately 20 atomic percent of a dopant, the dopant selected from a group consisting of aluminum, platinum, silicon, gallium, and germanium.

2. The device of claim 1, wherein the alloy has a work function of between approximately 3.8 eV to 4.4 eV.

3. The device of claim 2, wherein the source and drain regions comprise n-type regions and the substrate includes a p-type region underlying the source and drain regions.

4. The device of claim 1, wherein the alloy has a work function of between 4.9 eV and 5.5 eV.

5. The device of claim 4, wherein the source and drain regions comprise p-type regions and the substrate includes an n-type region underlying the source and drain regions.

6. The device of claim 1, wherein the alloy has a work function that does not significantly shift at a temperature up to approximately 900° Celsius.

7. The device of claim 1, wherein the gate electrode alloy does not react substantially with the insulating layer at a temperature up to approximately 900° Celsius.

8. The device of claim 1, wherein the transition metal is selected from a group consisting of titanium, zirconium, tantalum, hafnium, tungsten, chromium, molybdenum, vanadium, and niobium.

9. The device of claim 1, further comprising up to 5 atomic percent of a residual material, the residual material comprising at least one substance selected from a group consisting of oxygen, nitrogen, and chloride.

* * * * *